US010627505B2

(12) United States Patent
Janssen et al.

(10) Patent No.: US 10,627,505 B2
(45) Date of Patent: Apr. 21, 2020

(54) FRONT END FOR A RADAR SYSTEM AND METHOD OF OPERATION A FRONT END FOR A RADAR SYSTEM

(71) Applicant: NXP B.V.

(72) Inventors: Erwin Janssen, Veldhoven (NL); Cicero Silveira Vaucher, Eindhoven (NL)

(73) Assignee: NXP B.V., Eindhoven (NL)

( * ) Notice: Subject to any disclaimer, the term of this patent is extended or adjusted under 35 U.S.C. 154(b) by 268 days.

(21) Appl. No.: 15/707,916

(22) Filed: Sep. 18, 2017

(65) Prior Publication Data

US 2018/0149741 A1    May 31, 2018

(30) Foreign Application Priority Data

Nov. 28, 2016  (EP) .................................... 16200945

(51) Int. Cl.
   *G01S 13/88* (2006.01)
   *G01S 7/292* (2006.01)
   (Continued)

(52) U.S. Cl.
   CPC ................ *G01S 13/88* (2013.01); *G01S 7/02* (2013.01); *G01S 7/292* (2013.01); *G01S 7/35* (2013.01);
   (Continued)

(58) Field of Classification Search
   CPC ....................................................... G01S 13/02
   See application file for complete search history.

(56) References Cited

U.S. PATENT DOCUMENTS 4,626,826 A * 12/1986 Fukuda .............. G11B 20/1426
                                                341/58
5,304,996 A *  4/1994 Hsu ..................... H04L 25/4908
                                                341/95

(Continued)

FOREIGN PATENT DOCUMENTS

EP        2 818 887 A1    12/2014
JP        2014-153160 A    8/2014

OTHER PUBLICATIONS

8b/10b encoding on wikipedia, 11 pgs., retrieve from the internet Oct. 11, 2017 at: http://en.wikipedia.org/wiki/8b/10b_encoding.

(Continued)

*Primary Examiner* — Bernarr E Gregory
(74) *Attorney, Agent, or Firm* — Rajeev Madnawat (57) ABSTRACT

A front end for a radar system and method of operation are described. A timing circuit controls operation of a transmitter circuit and a receiver circuit and outputs a valid data signal indicating whether the receiver circuit will be receiving a reflected radar signal. A converter converts a received radar signal and outputs digital data. A serialising circuit receives the digital data and supplies a serial data stream including the digital data for a data processing device. The valid data signal is also communicated to the converter to cause the converter to output a bit pattern corresponding to a code word when the valid data signals indicates that the receiver circuit will not be receiving the reflected radar signal and to output a bit pattern corresponding to a data word including radar data when the valid data signals indicates that the receiver circuit will be receiving the reflected radar signal.

15 Claims, 7 Drawing Sheets

(51) Int. Cl.
- *G01S 7/40* (2006.01)
- *G01S 7/35* (2006.01)
- *G01S 7/02* (2006.01)
- *H03M 1/12* (2006.01)
- *G01S 13/02* (2006.01)
- *G01S 13/00* (2006.01)

(52) U.S. Cl.
CPC .......... *G01S 7/4008* (2013.01); *G01S 7/4021* (2013.01); *H03M 1/12* (2013.01)

(56) References Cited

U.S. PATENT DOCUMENTS

| | | | | |
|---|---|---|---|---|
| 5,389,931 | A * | 2/1995 | Anderson | G01S 13/422 342/192 |
| 5,949,365 | A * | 9/1999 | Wagner | G01S 13/48 342/70 |
| 5,955,991 | A * | 9/1999 | Kawakubo | G01S 13/48 342/374 |
| 7,345,619 | B2 * | 3/2008 | Hunt | G01S 7/28 327/106 |
| 7,423,577 | B1 | 9/2008 | McIntire et al. | |
| 2007/0152869 | A1 * | 7/2007 | Woodington | G01S 13/48 342/70 |
| 2007/0152870 | A1 * | 7/2007 | Woodington | G01S 7/414 342/70 |
| 2007/0152872 | A1 * | 7/2007 | Woodington | G01S 7/36 342/159 |
| 2007/0152873 | A1 | 7/2007 | Hunt | |
| 2007/0152874 | A1 * | 7/2007 | Woodington | G01S 7/36 342/159 |
| 2009/0121925 | A1 * | 5/2009 | Scott | G01S 3/784 342/195 |
| 2010/0039311 | A1 * | 2/2010 | Woodington | G01S 13/34 342/70 |
| 2012/0280856 | A1 | 11/2012 | Oswald | |
| 2015/0002328 | A1 * | 1/2015 | Vaucher | G01S 7/02 342/88 |

OTHER PUBLICATIONS

Texas Instruments Inc., Datasheet AFE5801 8-Channel Variable-Gain Amplifier (VGA) With Octal High-Speed ADC, 46 pgs.(May 2010).

* cited by examiner

FRONT END FOR A RADAR SYSTEM AND METHOD OF OPERATION A FRONT END FOR A RADAR SYSTEM

CROSS-REFERENCE TO RELATED APPLICATIONS

This application claims the priority under 35 U.S.C. § 119 of European Patent application no. 16200945.0, filed on Nov. 28, 2016, the contents of which are incorporated by reference herein.

The present specification relates to radar systems and in particular to digital radar systems and methods of operation.

Radar systems are generally known and have a wide range of applications. Some radar systems use a mixture of analog and digital electronics. In particular some radar systems have an analog front end (AFE) which is generally responsible for generating and transmitting the radio signal via one or more antennae, and processing the reflected signal received by one or more antennae to extract the useful information. The remainder of the radar system, generally referred to as the back end, may then process the extracted information, take any further action based thereon, and generally control the overall operation of the radar system and also interactions between the radar system and any other systems.

The back ends of digital radar systems generally include one or more digital microprocessors, such as a microcontroller either having its own on board, or separate Digital Signal Processor, for processing the radar information received via the analog front end. Hence, there is generally some form of interface between the analog front end and the digital domain of the microprocessor, which is sometimes referred to as a baseband processor, as it generally processes data of the baseband signal.

Radar systems having a separation between the analog frontend that receives the reflected radio and the digital baseband that analyses the radar reflections can give rise to a number of considerations. A result of this separation, sensitive analog radar signals need to be transferred between electronic devices, e.g. between integrated circuits (ICs), which can lead to signal degradation.

In radar systems using other system partitioning and transfer, a digitized version of the sensitive analog radar signal can be sent from the analog frontend to the digital baseband.

This approach can help reduce signal degradation, but can have drawbacks such as the number of physical wires required to carry the digital bits and also to indicate when the digital bits contain data corresponding to actual radar reflection. For example, some analog front ends operate in pulsed modes, such as using a chirp-sequence, and hence only a fraction of the data output from the receiver circuitry corresponds to valid radar data arising for signal reflections.

It can be important to ensure that this side-band information ("data valid") is accurately supplied to the base band processor as the baseband may analyze the incoming digital data in chunks, and the sideband information is required so that the baseband processor knows when it is receiving valid radar data that needs processing, and when it is not. This side band timing information should ideally be very accurate, and can be provided to a microprocessor from the front end using a high-speed and power-hungry signal.

Also when digitized data is transmitted from the front end to the baseband processor, various synchronization signals may also need to be supplied form the front end to the baseband processor, such as a bit clock signal (to identify the individual bits within a data word) and frame clock signal (to identify the individual data words within the stream of digital data). Hence, other physical wires may be used to supply this synchronization information to the baseband processor, in addition to the wires used to send the actual stream or streams of digital data.

Hence it would be beneficial to be able to interface an analog front end and the back end processor in a simple and/or lower power manner while maintaining system robustness.

According to a first aspect of the present disclosure, there is provided an analog front end for a radar system, comprising: a transmitter circuit configured to transmit a radar signal; a receiver circuit configured to receive and process a reflected radar signal and output a received radar signal; a timing circuit arranged to control operation of the transmitter circuit and the receiver circuit and output a valid data signal indicating whether the receiver circuit will be receiving the reflected radar signal; a converter configured to convert the received radar signal and output digital data; and a serialising circuit arranged receive the digital data from the converter and to supply a serial data stream including the digital data from the converter for a data processing device, wherein the valid data signal is also communicated to the converter to cause the converter to output a bit pattern corresponding to a code word when the valid data signals indicates that the receiver circuit will not be receiving the reflected radar signal and to output a bit pattern corresponding to a data word including radar data when the valid data signal indicates that the receiver circuit will be receiving the reflected radar signal.

By providing both code words and data words in a single data stream the presence of radar data may be signalled to a data processing device and/or synchronization information may be provided to the data processing device.

In one or more embodiments, the bit pattern corresponding to the code word may have the same bit frequency and/or word frequency as the bit pattern corresponding to a data word.

In one or more embodiments, the receiver circuit may be a first receiver circuit and the analog front end may further comprise: a second receiver circuit configured to receive and process the reflected radar signal and output a further received radar signal; and a multiplexer arranged to supply digital radar data from the first receiver circuit and the second receiver circuit to the serialising circuit, wherein the serialising circuit may be configured to supply a single serial data stream including radar data from the first receiver circuit and the second receiver circuit.

In one or more embodiments, the analog front end may further comprise only a single wire pair for connecting to the data processing device and wherein the serialising circuit may be configured to output the single serial data stream over the single wire pair.

In one or more embodiments, the converter may be an encoder arranged to encode the received radar signal and output digital data in an encoded form.

In one or more embodiments, the encoder may be configured to output a bit pattern corresponding to a code word when the valid data signals indicates that the receiver circuit will not be receiving the reflected radar signal.

In one or more embodiments, the encoded form may have on average a constant DC value.

In one or more embodiments, the encoder may be an 8b/10b encoder and/or the code word may be a k-code.

In one or more embodiments, the converter may be an analog-to-digital converter and wherein the analog-to-digital converter may be configured to output a sequence of bit patterns corresponding to pre-selected values of the analog-to-digital converter.

In one or more embodiments, the pre-selected values may be a maximum output value and a minimum output value of the analog-to-digital converter.

In one or more embodiments, the analog front may further comprise: an analog-to-digital converter arranged to digitise the received radar signal and output digital radar data; and a decimation circuit arranged to reduce the sampling frequency of the digital radar data output by the analog-to-digital converter.

In one or more embodiments, the analog front end may further comprise: a delay element arranged to introduce a delay into the valid data signal corresponding to any delay caused by the decimation circuit.

In one or more embodiments, the decimation circuit may be a programmable decimation chain and/or the delay element may be a programmable delay line.

According to a second aspect of the present disclosure, there is provided a radar system, including an analog front end according to the first aspect, and any preferred features thereof, and the data processing device connected to the analog front end to receive the serial data stream.

The radar systems may be an automotive radar system, or an industrial sensing system, or a gesture recognition system or a presence detection system, such as an intruder alarm system.

According to a third aspect of the present disclosure, there is provided a method of operating an analog front end for a radar system, comprising: converting a received radar signal from a receiver circuit into a digital received radar signal having a bit pattern corresponding to code word, when a timing signal indicates that the receiver circuit will not be receiving a radar signal; converting a received radar signal from the receiver circuit into a digital received radar signal having a bit pattern corresponding to data word including radar data, when a timing signal indicates that the receiver circuit will be receiving a radar signal; and outputting code words and data words as part of the same serial digital data stream to a digital data processing device.

Features of the first aspect may also be counterpart features for the third aspect.

Embodiments of the invention will now be described in detail, by way of example only, and with reference to the accompanying drawings, in which.

Similar items in the different Figures share like reference signs unless indicated otherwise.

Figure 1:
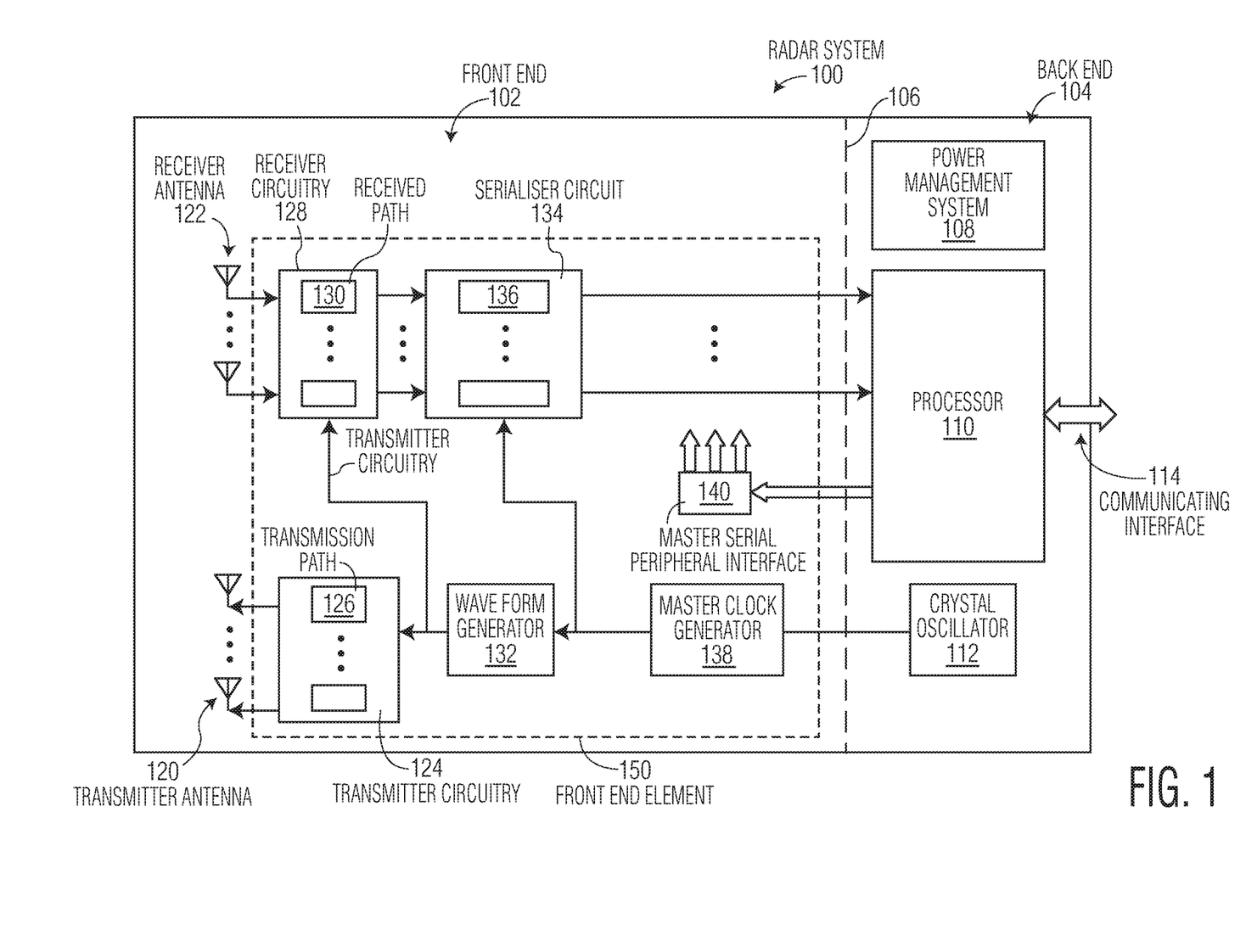
FIG. 1 shows a schematic block diagram of an example radar system.

With reference to FIG. 1 there is shown a schematic block diagram of an example radar system 100. Various conventional parts of the radar system 100 are omitted for the sake of clarity of explanation. However, they will be apparent to a person of ordinary skill in the art. The radar system 100 is particularly suitable for automotive applications, however, it can also be used in other applications, such as sensing systems for gesture recognition. Radar system 100 generally includes a front end 102 and a back end 104 generally demarcated by dashed line 106. The back end 104 includes a power management system 108, a data processor 110, which may be a microprocessor, micro controller, digital signal processor, system on chip or similar or any combination thereof, a crystal oscillator 112 and a bus or other communicating interface 114 via which the processor 110 can communicate with other parts of the back end (not shown) and/or with other systems or sub-systems of a vehicle, for example. For example, interface 114 may provide an Ethernet, controller area network (CAN) or FlexRay communications protocol.

The front end 102 is a generally analogue front end and includes one or more radar transmitter antennas 120 and one or more radar receiver antennas 122. The front end 102 also includes transmitter circuitry 124 including a respective transmitter path circuit, e.g. 126, for each transmitter antenna. Receiver circuitry 128 is also provided, including a received path circuit 130 for each respective receiver antenna 122. A wave form generator circuit 132 is also provided and which supplies a master local oscillator (LO) signal to each of the transmitter and receiver circuits. A serialiser circuit 134 is also provided and includes a respective serialiser circuitry 136 for each receiver circuit. A master clock generate circuit 138 is also provided and receives a signal from the crystal oscillator 112 and outputs a master clock signal to the wave form generator 132 and also to the serialiser circuitry 134. A master serial peripheral interface (140) is also provided in communication with data processor 110 and via which microprocessor 110 can communicate with the various parts of the analogue front end. It will be appreciated that in other embodiments, other types of control bus can be used instead. The serialiser circuitry 134 includes line driver circuitry via which digitised data is transmitted in low voltage differential signalling (LVDS) serial format over a pair of lines, e.g. 142, to the data processor 110. It will be appreciated that in other embodiments, other types of serial data transmission can be used instead. Hence, this provides the general analogue to digital conversion and interface between the analogue front end and the processor 110 being the digital base band.

Each of transmitter circuitry 124, receiver circuitry 128, serialised circuitry 134, wave form generator 132 and master clock generator 138 may be provided as an integrated circuit. These components are described in greater detail below.

Figure 2:
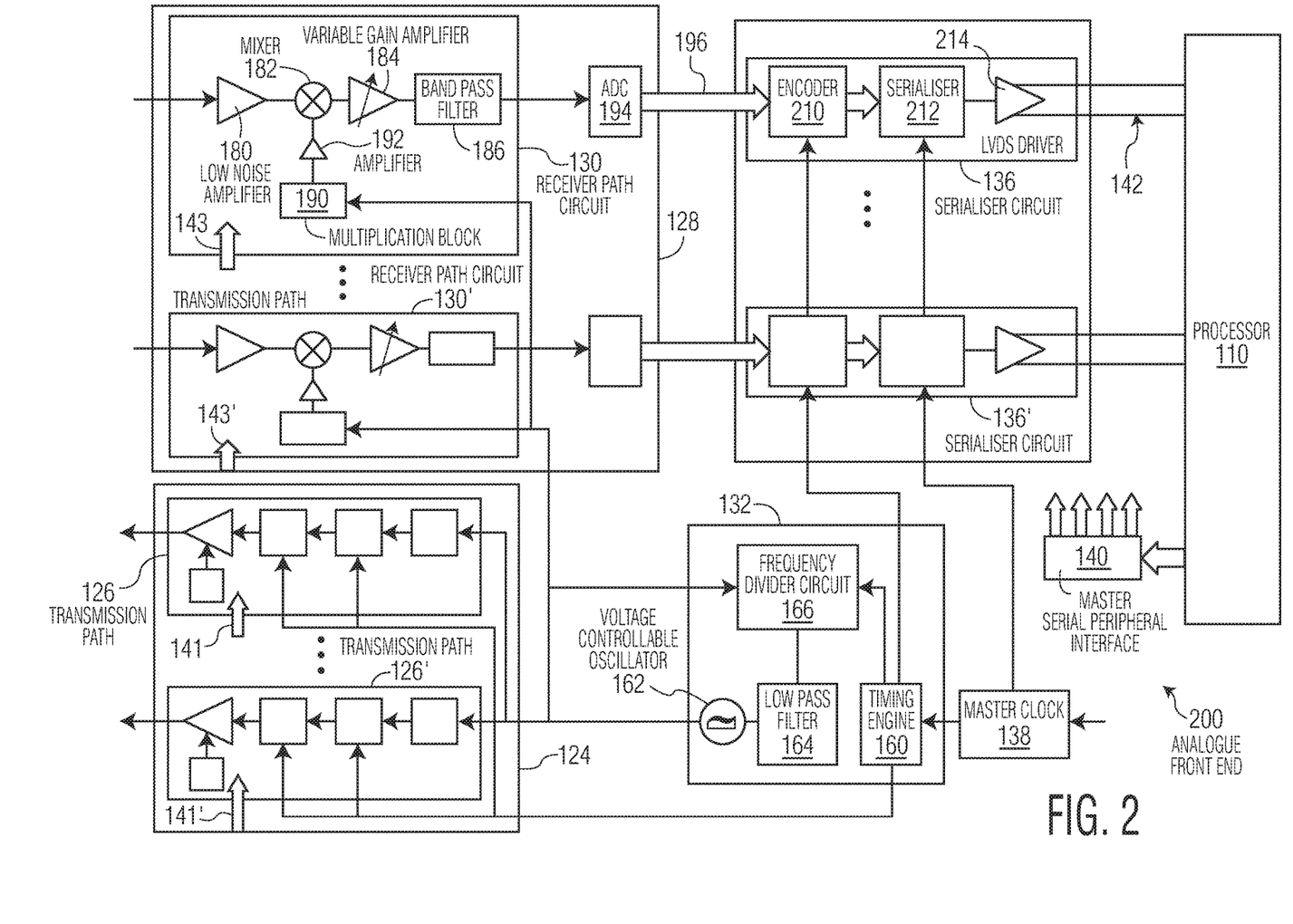
FIG. 2 shows a schematic block diagram of a first example of analog and digital parts of the radar system of FIG. 1.

FIG. 2 shows a schematic block diagram of a first example analogue front end 200 corresponding generally to the elements within dashed line 150 in FIG. 1, and the micro controller 110.

Master clock generator 138 supplies a master clock signal to wave form generator 132. Wave form generator 132 includes a timing engine 160 which provides various timing control signals to various parts of the circuity. Wave form generator 132 includes a phase lock loop including a voltage controllable oscillator 162, a low pass filter 164 and a $\Delta\Sigma$ modulation and optional frequency divider circuit 166 configured to produce a variable frequency local oscillator signal. The variable frequency local oscillator signal is applied to the transmitter circuitry 124 and receiver circuitry 128 to enable a chirp radar signal to be transmitted and received.

The transmission path circuitry 126 includes a ×3 multiplication block 170, a controllable switch 172, a binary phase shifter 174, a power amplifier 176 and a level detector 178. Each transmission path 126, 126' is similar. Each transmission path 126, 126' is attached to the SPI bus and receives the available frequency local oscillator signal and also control signals from timing engine 160 to start and stop a sequence of chirp transmissions.

Each received path, e.g. 130, includes a low noise amplifier 180, a mixer 182, a variable gain amplifier 184, a band pass filter 186, a ×3 multiplication block 190 and a further amplifier 192 connected to a second input of mixer 182. Each receiver path circuit 130 is similarly in communication with the SPI, e.g. 143, and also receives the variable frequency local oscillator signal as an input from wave form generator circuit 132. As is generally known in the art, any reflected radar signal is mixed with the local oscillator signal and the resulting intermediate frequency signal is generated by the circuitry and output on the receiver path 130.

The output intermediate frequency signal is output to an analog-to-digital converter 194, which may be, for example a 12 bit SAR (Successive Approximation Register) analog-to-digital converter. ADC 194 outputs a 12 bit parallel data word at a data rate of 480 Mb per second over a parallel data channel 196 to serialiser circuit 136. Serialiser 136 includes an 8b/10b encoder 210 which supplies a 10 bit data word in parallel format at a 600 Mb per second rate parallel to serialiser 212. Two adjacent 12 bit data words (corresponding to 24 bits in total) are provided as three 8-bit words to 8b/10b encoder 210 which then outputs three 10-bit words to serialiser 212. Serialiser 212 serialises the 10 bit encoded parallel input data and outputs a sequence of individual bits as a data signal to LVDS driver 214. LVDS driver 214 then transmits the sequence of serial data bits (effectively 1-bit words) over a pair of wires 142 using differential signalling, as is generally known in the art, to microcontroller 110. Each 8b/10b encoder of each serialiser circuit receives a signal from timing engine 160. The timing engine 160 outputs a signal indicating when the receiver circuit can be expecting to receiver a valid radar signal and hence corresponds to a window of radar activity. This timing signal is also referred to herein as a "valid data" signal as when the signal is high, it indicates that the incoming data can be considered to be valid data and when the signal is low it indicates that no valid data is expected. Parallel to serial converter 212 of each serialiser circuit 136 also receives the master clock signal from master clock 138 to clock the parallel to serial conversion.

As described in greater detail below, when the window active or valid data signal from timing engine 160 is low, then 8b/10b encoder 210 outputs an 8b/10b control code, also referred to as a k-code, indicating a 10 bit data word corresponding to a code or control signal rather than a valid data signal. When the window active or valid data signal from timing engine 160 is high, then 8 bit/10 bit encoder carries out its normal encoding process and output a 10 bit data word rather than a control word.

The single data link 142 can be used to perform synchronisation between the front end and processor 110 and also to indicate the start of valid data. The 8b/10b control words are used to perform synchronisation between the front end and the base band processor so that the base band processor knows which bit of the digitised signal is the first transmitted bit. Otherwise, it is not possible to determine the start of a data word from a random sequence of bits. Also, the 8b/10b control words can be used to indicate that data is not of interest to the base band processor. However, when the data received by the processor is not a 8b/10b control word, then the processor can recognise that this is useful data to be processed. Hence, by switching between control words and data words all the necessary timing information is available to the processor since the control words are transmitted at the same rate as real data words, hence, the necessary timing information is available at the highest possible resolution and without any extra overhead.

Figure 3:
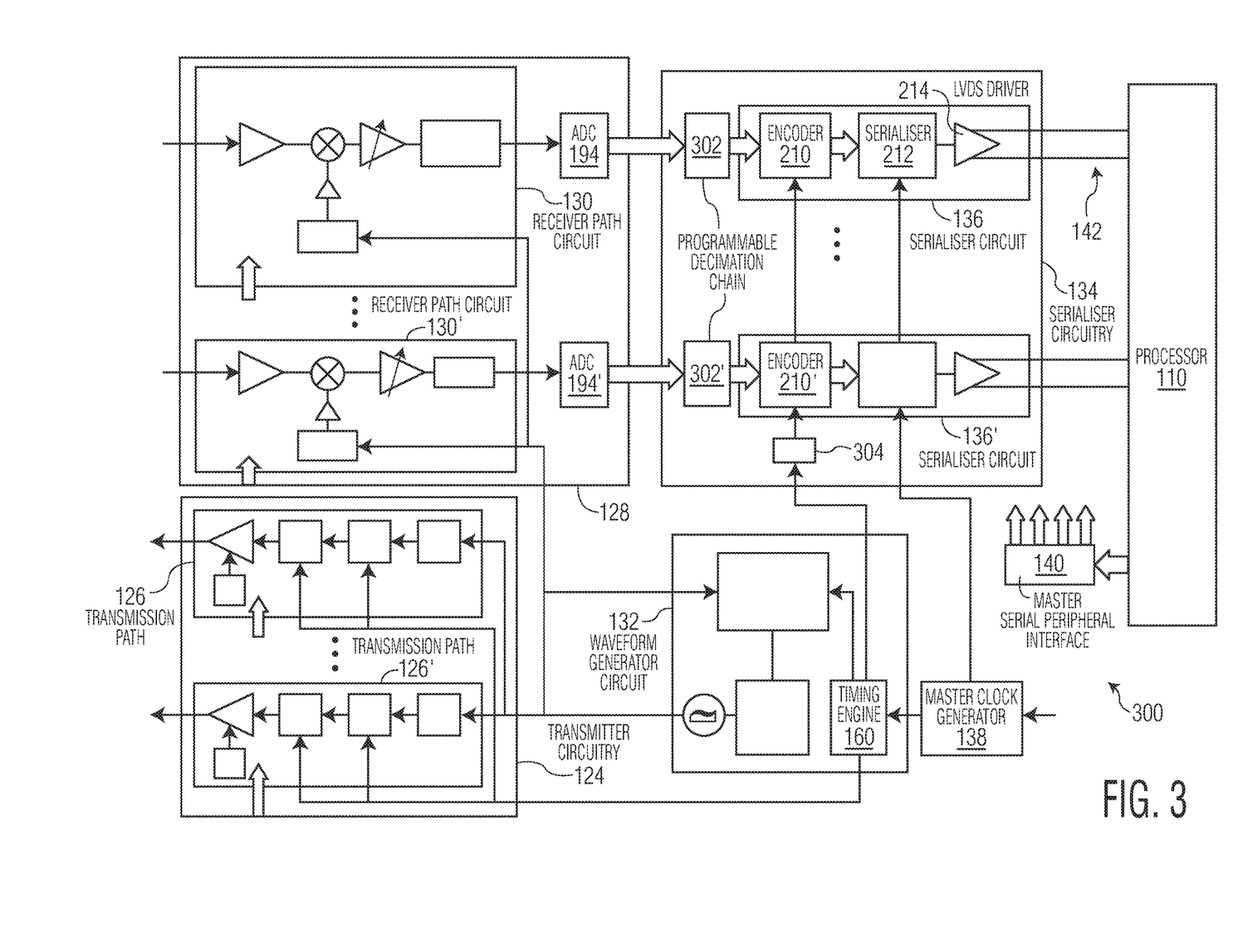
FIG. 3 shows a schematic block diagram of a second example of analog and digital parts of the radar system of FIG. 1.

FIG. 3 shows a schematic block diagram of a second radar front end system 300 similar to system 200 shown in FIG. 2. However, in FIG. 3, a programmable decimation chain 302 is provided between the ADC 194, 194' and the serialiser circuitry 136. Also, a programmable delay line 304 is provided between the timing engine 160 so as to introduce a time delay into the valid data signal supplied to the 8b/10b encoder 210, 210'. The programmable decimation chain (PDC) 302, 302' effectively changes the sampling bandwidth by reducing the effective sampling frequency. By using higher decimation factors the amount of data transmitted to the microprocessor over the serial interface 142 is reduced thereby reducing the memory size required in the microprocessor 110 to store the data.

However, a programmable decimation chain will add latency to the data flow as they typically include some form of finite impulse response operation, such as filtering, of the data. Hence, when a PDC element 302, 302', is introduced, the timing signal output from timing engine 160 would be inconsistent. Hence, a programmable delay line (PDL) 304 is introduced between the timing engine and the timing signal input to the 8b/10b encoder 210, 210'. Without the delay element, the timing engine signal would lead to a switch to a "valid data" mode too soon, i.e., before the first data words would actually include valid radar data. The length of delay of the programmable delay line 304 is programmed to match the delay caused by the programmable decimation chain. Hence, by delaying the window active signal from timing engine 160, the 8b/10b encoder switches from outputting control codes to data codes at a time matched to your arrival of valid radar data after its input.

Figure 4:
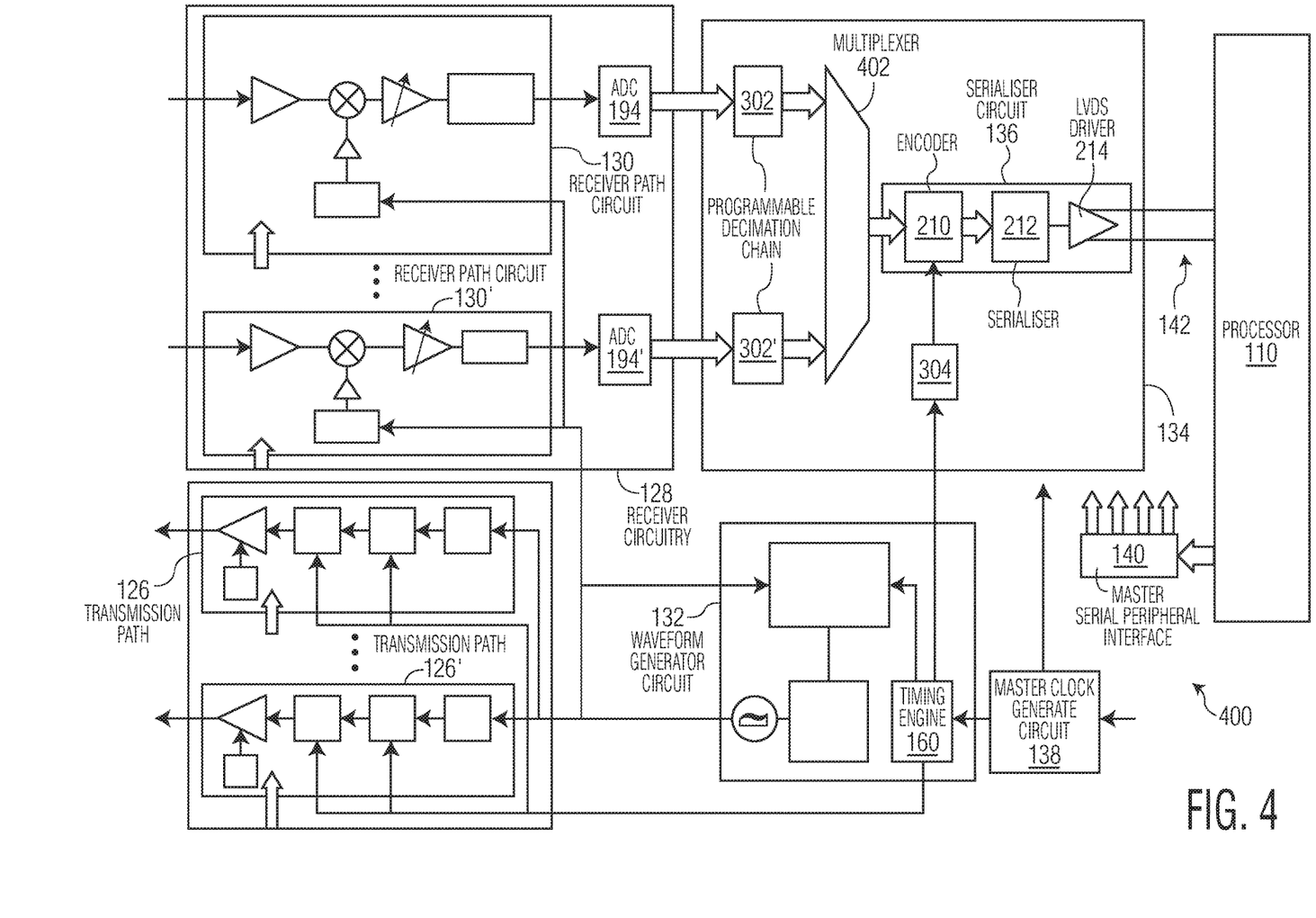
FIG. 4 shows a schematic block diagram of a third example of analog and digital parts of the radar system of FIG. 1.

With reference to FIG. 4, there is shown a schematic block diagram of a third example front end 400 again, similar to the front ends 200, 300 shown in FIGS. 2 and 3.

Similarly to front end 300, the serialiser circuit 134 includes a programmable decimation chain 302, 302' for each receiver path circuit 130, 130'. However, only a single serialising circuit 136 is provided. A multiplexer 402 is provided to combine the outputs of the PDCs 302, 302' and provide a single parallel data stream to the 8b/10b encoder 210 of the serialised circuitry 136. Again, a programmable delay line 304 is provided between timing engine 160 and the input to the 8b/10b encoder to introduce a similar delay to the valid signal to delays caused by the PDC elements 302, 302'. Hence, in the front end 400 illustrated in FIG. 4, a single wire pair provides a single data stream including all of the radar data for multiple radar receivers, and all the required valid data and timing synchronisation information in a single stream to microprocessor 110.

Although the above three example systems describe the use of 8b/10b encoding control words as the synchronisation and start of valid data mechanism, it would be appreciated that the same approach can be applied using other types of reserved bit sequences. For example, instead of using 8b/10b k-code words, other control symbols can be used to synchronise the front end and the base band processor.

Figure 5:
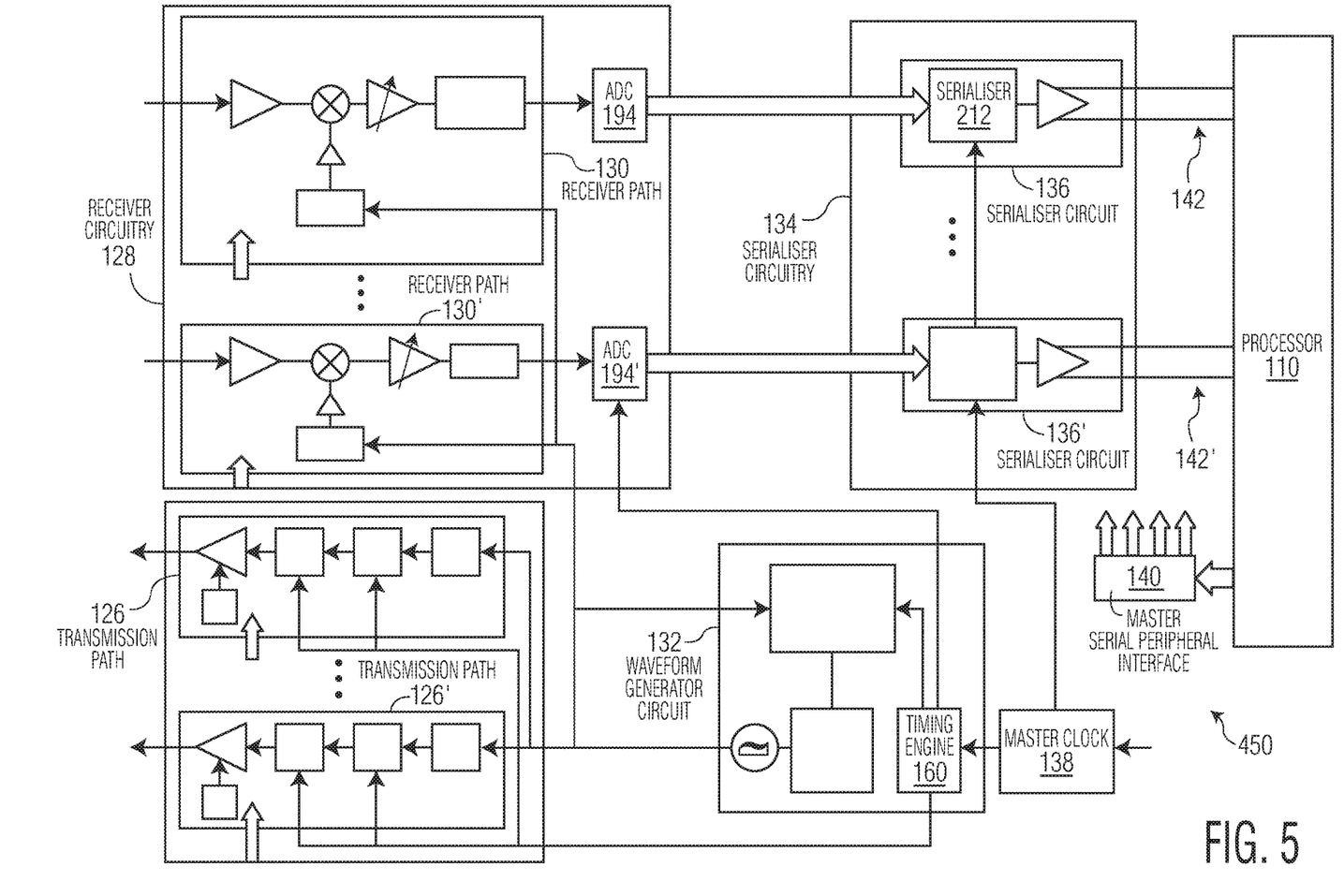
FIG. 5 shows a schematic block diagram of a fourth example of analog and digital parts of the radar system of FIG. 1.

FIG. 5 shows a fourth example system 450, generally similar to the first to third examples. However, in this system the 8b/10b encoder is omitted and instead the "data valid" control signal form the timing engine 160 is supplied to, and controls, each of the ADCs 194, 194' in the receiver chains. Hence, if the 8b/10b encoder is omitted, other control symbols or control words can be used instead to synchronise the front end and base band processor and also to indicate the start of valid data. A dedicated pattern, constructed from normal data words, is transmitted from the serialiser circuit 136 to the microprocessor 110. A pattern of data words is selected such that the specific sequence of data words would not happen during normal operation of the radar system. In the most general case, this condition may not be met. However, in the specific case of a radar application, this is possible.

The timing engine 'window active' signal is supplied to the ADCs 194, 194' attached to each of the receiver path circuits 130, 130'. When the window active signal is low, indicating no valid radar data being received, then each ADC 194, 194' alternately outputs a data word corresponding to its maximum value and then a data word corresponding to its minimum value. Hence, when this pattern of maximum value and minimum value data words is received by the microprocessor, these can be recognised similarly to the k-codes as described above. Hence, when the fixed pattern of a sequence of maximum value and minimum value data words is received by the microprocessor the base band processor 110 can assume that radar data is not being transmitted. Such a pattern of extreme output values would not be seen in real radar data. This would correspond to the ADCs 194, 194', clipping every sample which is extremely unlikely in practice and would result in no information in the signal. Hence, using this combination and sequence of data words, it is possible to notify the processor when valid data is being transmitted or not and also to synchronise the front end and base band processor over the same wires 142 to the processor.

Figure 6:
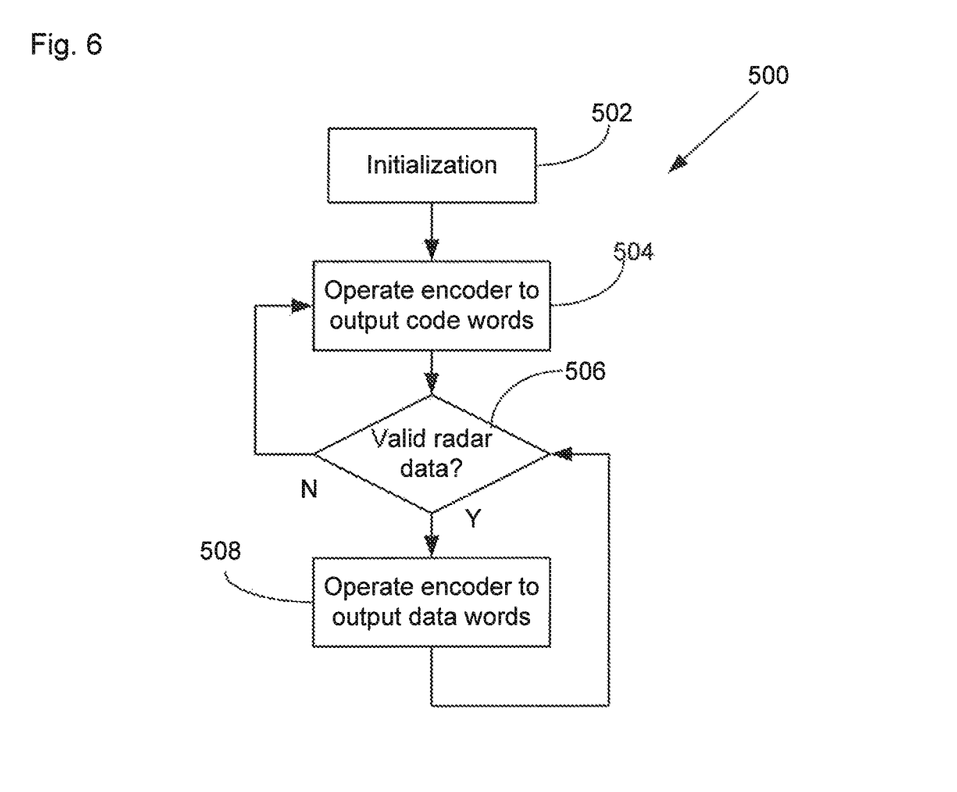
FIG. 6 shows a process flow chart illustrating a method of operation of the analog and digital parts.
Figure 7:
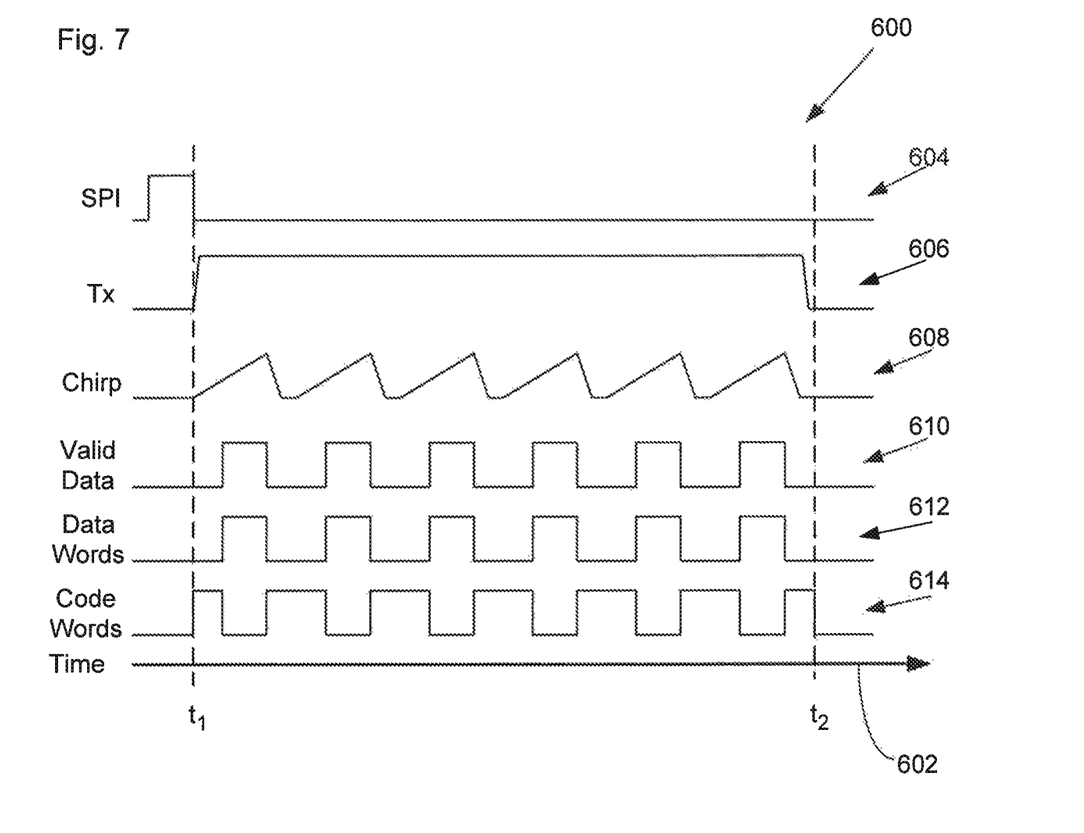
FIG. 7 shows a timing diagram illustrating the state of various signals during operation.

With reference to FIG. 6, there is shown a process flow chart 500 illustrating the method of operation in greater detail. FIG. 7 shows a timing diagram 600 which shows various signals in the system as a function of time 602. Trace 604 represents a control signal sent on the SPI bus. Trace 606 represents the activity of the transmitter circuit 124. Trace 608 represents the radar chirp signal. Trace 610 represents the valid data signal output by timing engine 160. Trace 612 represents the output bit patterns for radar signals as data words from serialiser circuitry 136 to microprocessor 110. Trace 614 represents the output of bit patterns corresponding to code words or control words from serialiser circuit 136, 136' to microprocessor 110.

As illustrated in FIG. 6, the system is initialised at 502. A signal is sent by processor 110 over the SPI bus indicating that a new chirp sequence is to start on the falling edge of SPI signal 604 at time T1. Hence, transmission circuit 124 becomes active and under control of timing engine 160, wave form generator circuit 132 outputs an increasing frequency local oscillator signal, corresponding to chirp signal 608, to transmission paths 126, 126' causing chirp radar signals to be output by transmission antennas 120. At time t1, just before the chirp signal 608 starts to grow, timing engine 160 sets the value of the valid data signal 610 to low indicating that no valid radar signal is expected on receiver circuits 128. Hence, initially, the valid data signal 610 is low and therefore 8b/10b encoder 210, 210' outputs a control word bit sequence at 504 and as illustrated by trace 614 being high.

Processing proceeds to 506 at which it is determined whether valid radar data is expected yet or not. While valid data signal 610 is low, no valid radar data is expected and therefore 8b/10b encoder continues to output control word data sequences at 504.

Eventually, valid reflected radar signals may be expected and therefore timing engine 160 sets the valid data signal 610 high. Hence, at 508, 8b/10b encoder stops outputting control word data sequences and instead outputs 8b/10b encoded data words corresponding to the received radar data, as illustrated by data word signal 612 being high and code word signal 614 being low. When the valid data signal next goes low 610, corresponding to the window active signal output by timing engine 160 going low, valid radar data is no longer expected and therefore processing proceeds to 504 at which the 8b/10b encoder stops outputting encoded data words and instead starts outputting control words at 504, as illustrated by data word signal 612 going low and code word signal 614 going high.

Processing continues in this way for each chirp signal within the current sequence until the current chirp signal sequence ends at time t2. The micro controller 110 can then initiate a next chirp sequence by issuing a next start of chirp sequence signal over the SPI.

Hence, the above described approach avoids the need to send a separate "data valid" side band signal resulting in a more robust, cheaper and lower power solution than traditional solutions utilising one or more extra synchronisation signals. Further, the synchronisation signals for the data can be sent with the data itself, rather than requiring separate bit clock and frame clock signals.

Hence, by combining the side-channel timing information and the radar data in a single stream, accurate timing information is provided to the microprocessor without requiring additional wires or power. Hence, this approach improves the timing accuracy and also reduces the hardware and power requirements compared to other approaches.

Further, fewer LVDS differential lines connecting between the radar front end and microprocessor may be used, compared to other approaches. Therefore, a lower power and smaller printed circuit board may be used.

There is no need to send separate bit clock and frame clock signals as all the clock information and frame information is automatically built into the serialised stream sent to the microprocessor. Hence, there are no issues with time and alignment.

In systems in which 8b/10b data encoding is used, this shifts the spectral content away from the intermediate frequency band used by the front end radar system. Hence, there is a decreased risk of interference from the LVDS signals on to the intermediate frequency stream.

Hence, the approach of switching between control word data patterns actual data word data patterns, allows the microprocessor to distinguish between valid and invalid data and also provides all the synchronisation timings required as the control words are transmitted at the same rate as real data words.

The above described approach is also preferable compared to the approach of transmitting an information header before actual data. The insertion of header data would add latency to the system. Further, there would still be the requirement to transmit synchronisation information for the serial data stream.

The system illustrated in FIG. 4 is particularly advantageous in applications where the processor 110 may be located in a different physical location from the radar front end. The system illustrated in FIG. 4 allows a single simple twisted pair connection to transfer all the data required from the front end to the microprocessor.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Any instructions and/or flowchart steps can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

While the disclosure is amenable to various modifications and alternative forms, specifics thereof have been shown by way of example in the drawings and described in detail. It should be understood, however, that other embodiments, beyond the particular embodiments described, are possible as well. All modifications, equivalents, and alternative embodiments falling within the scope of the appended claims are covered as well.

The invention claimed is:

1. A front end for a radar system, comprising:
   a transmitter circuit configured to transmit a radar signal;
   a receiver circuit configured to receive and process a reflected radar signal and output a received radar signal;
   a timing circuit arranged to control operation of the transmitter circuit and the receiver circuit and output a valid data signal indicating whether the receiver circuit will be receiving the reflected radar signal;
   a converter configured to convert the received radar signal and output digital data; and
   a serialising circuit arranged to receive the digital data from the converter and to supply a serial data stream including the digital data from the converter for a data processing device, wherein the valid data signal is also communicated to the converter to cause the converter to output a bit pattern corresponding to a code word when the valid data signals indicates that the receiver circuit will not be receiving the reflected radar signal and to output a bit pattern corresponding to a data word including radar data when the valid data signal indicates that the receiver circuit will be receiving the reflected radar signal.

2. The front end as claimed in claim 1, wherein the bit pattern corresponding to the code word has the same bit frequency and/or word frequency as the bit pattern corresponding to the data word.

3. The front end as claimed in claim 1, wherein the receiver circuit is a first receiver circuit and wherein the front end further comprises:
   a second receiver circuit configured to receive and process the reflected radar signal and output a further received radar signal; and
   a multiplexer arranged to supply digital radar data from the first receiver circuit and the second receiver circuit to the serialising circuit, wherein the serialising circuit is configured to supply a single serial data stream including radar data from the first receiver circuit and the second receiver circuit.

4. The front end as claimed in claim 3, further comprising only a single wire pair for connecting to the data processing device and wherein the serialising circuit is configured to output the single serial data stream over the single wire pair.

5. The front end as claimed in claim 1, wherein the converter is an encoder arranged to encode the received radar signal and output digital data in an encoded form.

6. The front end as claimed in claim 5, wherein the encoder is configured to output a bit pattern corresponding to a code word when the valid data signals indicates that the receiver circuit will not be receiving the reflected radar signal.

7. The front end as claimed in claim 6, wherein the encoded form has on average a constant DC value.

8. The front end as claimed in claim 5, wherein the encoder is an 8b/10b encoder and the code word is a k-code.

9. The front end as claimed in claim 1, wherein the converter is an analog-to-digital converter and wherein the analog-to-digital converter is configured to output a sequence of bit patterns corresponding to pre-selected values of the analog-to-digital converter.

10. The front end as claimed in claim 9, wherein the pre-selected values are a maximum output value and a minimum output value of the analog-to-digital converter.

11. The front end as claimed in claim 1 and further comprising:
    an analog to digital converter arranged to digitise the received radar signal and output digital radar data; and
    a decimation circuit arranged to reduce the sampling frequency of the digital radar data output by the analog to digital converter.

12. The front end as claimed in claim 11, and further comprising:
    a delay element arranged to introduce a delay into the valid data signal corresponding to any delay caused by the decimation circuit.

13. The front end as claimed in claim 12, wherein the decimation circuit is a programmable decimation chain and the delay element is a programmable delay line.

14. An automotive radar system, including the front end as claimed in claim 1 and the data processing device connected to the front end to receive the serial data stream.

15. A method of operating a front end for a radar system, comprising:
    converting a received radar signal from a receiver circuit into a digital received radar signal having a bit pattern corresponding to code word, when a timing signal indicates that the receiver circuit will not be receiving a radar signal;
    converting a received radar signal from the receiver circuit into a digital received radar signal having a bit pattern corresponding to data word including radar data, when a timing signal indicates that the receiver circuit will be receiving a radar signal; and
    outputting code words and data words as part of the same serial digital data stream to a digital data processing device.

* * * * *